United States Patent
Ozawa et al.

(10) Patent No.: US 8,916,840 B2
(45) Date of Patent: Dec. 23, 2014

(54) LITHOGRAPHY APPARATUS, AND ARTICLE MANUFACTURING METHOD

(71) Applicant: Canon Kabushiki Kaisha, Tokyo (JP)

(72) Inventors: Kimitaka Ozawa, Utsunomiya (JP); Michio Yanagisawa, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/772,816

(22) Filed: Feb. 21, 2013

(65) Prior Publication Data

US 2013/0230806 A1    Sep. 5, 2013

(30) Foreign Application Priority Data

Feb. 21, 2012 (JP) ................. 2012-034658

(51) Int. Cl.
*G21K 5/04* (2006.01)
*H01J 37/317* (2006.01)
*H01J 37/304* (2006.01)

(52) U.S. Cl.
CPC ......... *H01J 37/3174* (2013.01); *H01J 37/3045* (2013.01); *H01J 2237/24514* (2013.01)
USPC ................ 250/492.3; 250/492.1; 250/492.2

(58) Field of Classification Search
USPC ................ 250/492.1, 492.2, 492.21, 492.22, 250/492.23, 492.3
See application file for complete search history.

(56) References Cited

U.S. PATENT DOCUMENTS

2007/0057204 A1* 3/2007 Kruit et al. ............... 250/492.23

FOREIGN PATENT DOCUMENTS

JP    7022303 A    1/1995

* cited by examiner

*Primary Examiner* — Nicole Ippolito
(74) *Attorney, Agent, or Firm* — Rossi, Kimms & McDowell LLP

(57) ABSTRACT

A lithography apparatus includes a deflector configured to deflect the charged particle beam to scan the charged particle beam on the substrate in a scan direction; a detector including a shield for shielding the charged particle beam, and configured to detect an intensity of a charged particle beam not shielded by the shield; and a processor configured to process a signal obtained with the detector scanned with the charged particle beam in the scan direction by the deflector, wherein an effective region of the shield has a shape such that a position of an edge thereof in the scan direction continuously changes along the edge, and wherein the processor is configured to process the signal with respect to a plurality of positions of the edge to determine a relationship between a command value to the deflector and a scan position of the charged particle beam.

8 Claims, 8 Drawing Sheets

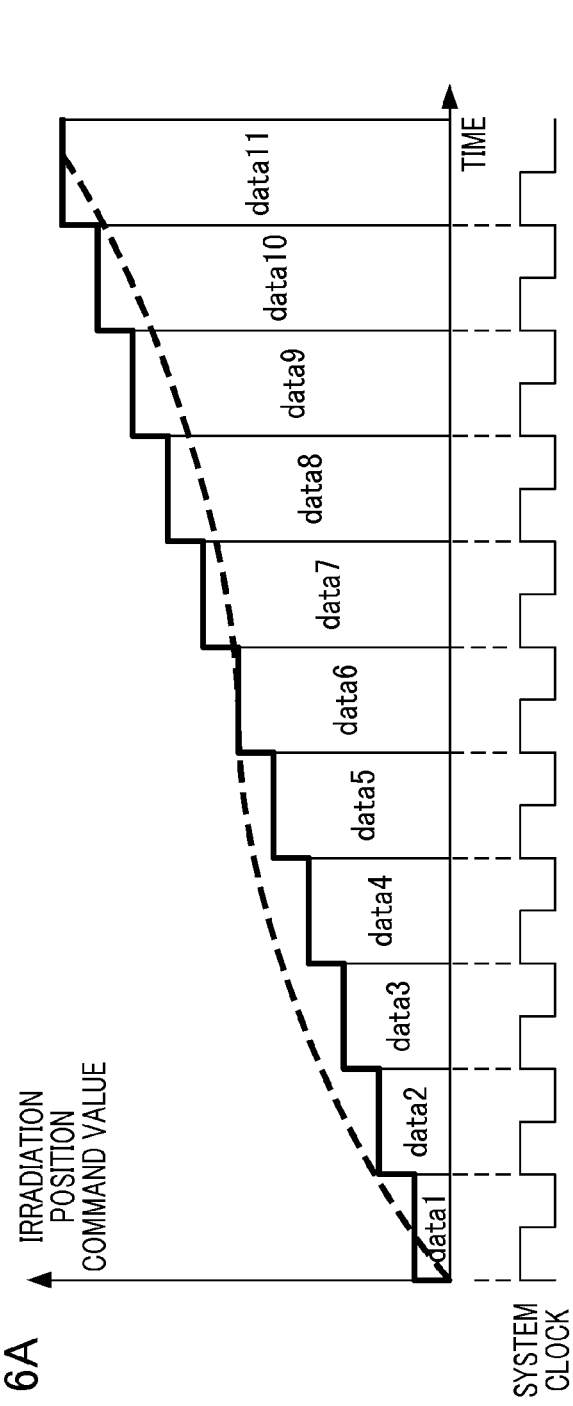
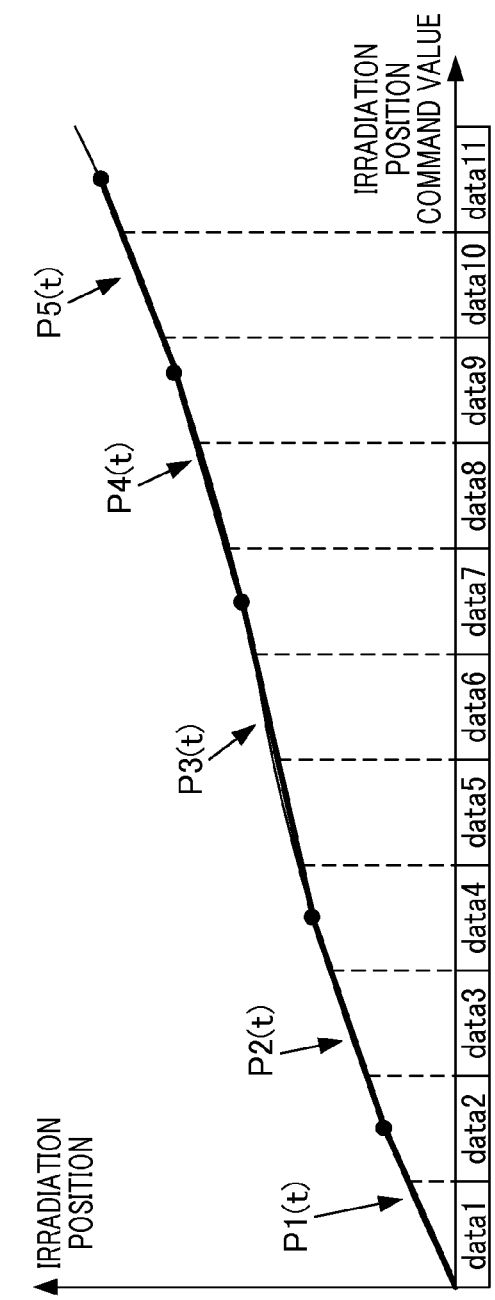
FIG. 6A
FIG. 6B

LITHOGRAPHY APPARATUS, AND ARTICLE MANUFACTURING METHOD

BACKGROUND OF THE INVENTION

1. Field of the Invention

The present invention relates to a lithography apparatus, and an article manufacturing method using the apparatus.

2. Description of the Related Art

Lithography apparatuses that perform writing on a substrate by controlling deflection scanning and blanking of charged particle beams such as electron beams are known. The lithography apparatuses may be employed as one of pattern forming technologies that is an alternative to optical exposure systems for the production or the like of a memory device of 4GDRAM or later with a line width of 0.1 µm or less. Here, since the lithography apparatus controls the scan position of an electron beam on a substrate using a deflector (scanning deflector), the relationship between a command value to be given to the deflector and the scan position of an electron beam needs to be accurately measured for improving writing accuracy. Japanese Patent Laid-Open No. 7-22303 discloses an electron beam lithography apparatus that estimates the scan position of an electron beam between reference marks from the time required for scanning the electron beam among a plurality of reference marks.

In general, it is preferable that the relationship between a command value to be given to the deflector and the scan position of an electron beam is linear. However, in practice, the relationship may not be linear due to uneven potential between electrodes caused by production error of the electrodes constituting the deflector, a linearity error of a digital-analog converter mounted on an amplifier for driving the deflector, or the like. Thus, in the case of the lithography apparatus disclosed in Japanese Patent Laid-Open No. 7-22303 in which the resolution of the scan position of an electron beam is determined by physical spacing between reference marks, the scan position of an electron beam cannot be accurately determined when the relationship is nonlinear.

SUMMARY OF THE INVENTION

The present invention provides, for example, a lithography apparatus that is advantageous for accurate writing.

According to an aspect of the present invention, a lithography apparatus that performs writing on a substrate with a charged particle beam is provided that includes a deflector that scans the substrate by deflecting the charged particle beam; a detector that includes a deflector configured to deflect the charged particle beam to scan the charged particle beam on the substrate in a scan direction; a detector including a shield for shielding the charged particle beam, and configured to detect an intensity of a charged particle beam not shielded by the shield; and a processor configured to process a signal obtained with the detector scanned with the charged particle beam in the scan direction by the deflector, wherein an effective region of the shield has a shape such that a position of an edge thereof in the scan direction continuously changes along the edge, and wherein the processor is configured to process the signal with respect to a plurality of positions of the edge to determine a relationship between a command value to the deflector and a scan position of the charged particle beam.

According to the present invention, a lithography apparatus that is advantageous for performing accurate writing may be provided.

Further features of the present invention will become apparent from the following description of exemplary embodiments with reference to the attached drawings.

BRIEF DESCRIPTION OF THE DRAWINGS

FIGS. 6A and 6B are graphs illustrating the relationship between a scan position command value and a scan position according to the first embodiment.

DESCRIPTION OF THE EMBODIMENTS

Hereinafter, preferred embodiments of the present invention will be described with reference to the drawings.

(First Embodiment)

Figure 1:
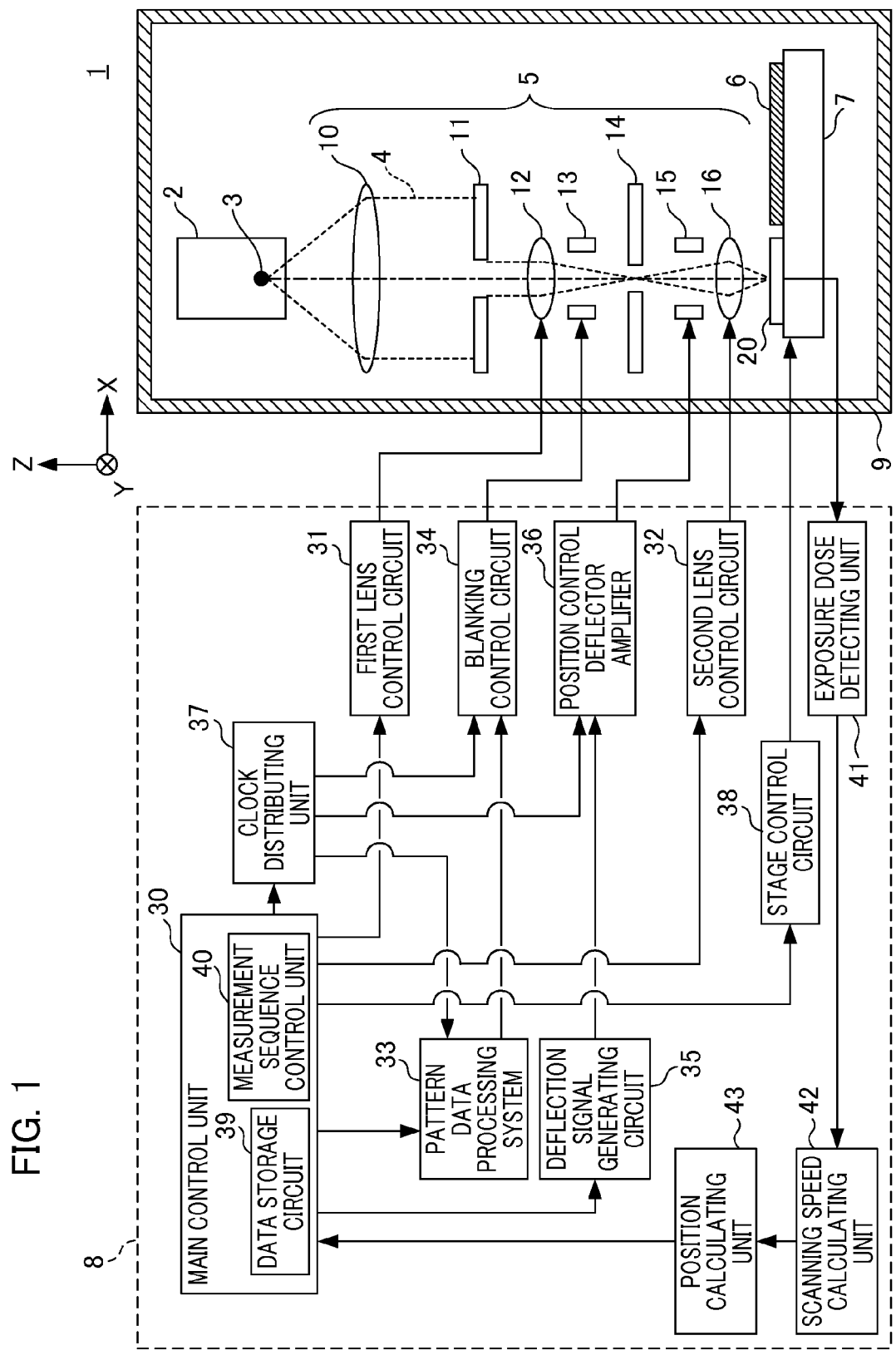
FIG. 1 is a diagram illustrating the configuration of a charged particle beam lithography apparatus according to a first embodiment of the present invention.

Firstly, a description will be given of a charged particle beam lithography apparatus (hereinafter referred to as "lithography apparatus") according to a first embodiment of the present invention. As an example, the lithography apparatus of the present embodiment writes predetermined writing data at a predetermined position on a substrate by deflecting (scanning) a single electron beam (charged particle beam) and by controlling the blanking (OFF irradiation) of the electron beam. Here, a charged particle beam is not limited to an electron beam used in the present embodiment, but may be other charged particle beams such as an ion beam. FIG. 1 is a diagram illustrating the configuration of a lithography apparatus 1 according to the present embodiment. In the following drawings, a description will be given in which the Z axis is in an irradiation direction of an electron beam to a substrate, and the X axis and the Y axis are mutually oriented in directions orthogonal to a plane perpendicular to the Z axis. Furthermore, in the following drawings, the same elements as those shown in FIG. 1 are designated by the same reference numerals. Firstly, the lithography apparatus 1 includes an electron gun 2, an optical system 5 that splits an electron beam 4 emitted from a crossover 3 of the electron gun 2 into a plurality of electron beams, and deflects and focuses the plurality of electron beams, a substrate stage 7 that holds a substrate 6, and a controller 8 that controls the operation of the components of the lithography apparatus 1. Note that the electron beam 4 is readily attenuated under an atmosphere at normal pressure and is also discharged under high voltage. In order to prevent such a phenomenon, the components except for the controller 8 are installed in a space of which the internal pressure is adjusted by a vacuum exhaust system (not shown). For example, the electron gun 2 and the optical system 5 are installed in an electronic optical barrel that is held under a high vacuum. Likewise, the substrate stage 7 is installed in a chamber that is held under a relatively lower vacuum than that in the electronic optical barrel. In FIG. 1, an electronic optical barrel and a chamber are integrally shown as a barrel 9. Also, the substrate 6 serving as a substrate to be treated is a wafer consisting, for example, of single crystal silicon, a photosensitive resist is coated on the surface of the substrate 6.

The electron gun 2 is a mechanism that emits the electron beam 4 by applying heat or electric field, in FIG. 1, tracks of the electron beam 4 emitted from the crossover 3 are shown by dotted lines. In order from the electron gun 2 to the substrate 6, the optical system 5 includes a collimator lens 10, an aperture 11, a first electrostatic lens 12, a blanking deflector 13, a blanking aperture 14, a deflector 15, and a second electrostatic lens 16. The collimator lens 10 is an electromagnetic lens that collimates the electron beam 4 emitted from the crossover 3 into a collimated beam. The aperture 11 has a circular opening, and aligns the electron beam 4 incident from the collimator lens 10 so as to make the electron beam 4 emit toward the first electrostatic lens 12. The first electrostatic lens 12 is constituted by three electrode plates (in FIG. 1, three electrode plates are shown integrally as an integral plate) each having a circular opening and focuses the electron beam 4 to the blanking aperture 14. The blanking deflector 13 and the blanking aperture 14 perform the ON (non-blanking state)/OFF (blanking state) operation of the irradiation of the electron beam 4. In particular, the blanking aperture 14 is arranged at a position at which the first electrostatic lens 12 first forms the crossover of the electron beam 4. The deflector (scanning deflector) 15 deflects (scans) an image on the surface of the substrate 6 placed on the substrate stage 7 or on the detection surface of an electron beam detector 20 (to be described below) in the plane direction (e.g., X-axis direction). Furthermore, the second electrostatic lens 16 focuses the electron beam 4, which has passed through the blanking aperture 14, onto the substrate 6 or the electron beam detector 20.

The substrate stage 7 is movable at least in the XY axis direction while holding the substrate 6 using, for example, electrostatic force, the position is measured in real time by an interferometer (laser length measuring machine) (not shown). Also, the substrate stage 7 includes an electron beam detector (hereinafter referred to as "detector") 20 that detects the intensity of the electron beam 4 on the surface thereof.

The controller 8 includes various control circuits that control the operation of the components related to writing with the lithography apparatus 1, and a main control unit 30 that supervises the control circuits. As the control circuits, firstly, a first lens control circuit 31 controls the operation of the collimator lens 10 and the first electrostatic lens 12. A second lens control circuit 32 controls the operation of the second electrostatic lens 16. A pattern data processing system 33 generates writing data (pattern data), and converts the writing data into bitmap data, and then generate a command value (blanking signal) to be transmitted to a blanking control circuit 34. The blanking control circuit 34 controls the blanking deflector 13 based on the received blanking signal. A deflection signal generating circuit 35 transmits a command value (deflection signal) of a scan position to a position control deflector amplifier 36 at the timing of the rising edge of a system clock to be distributed by a clock distributing unit 37 to be described below. It is essential that the scan position command value varies monotonously and the scan position command value preferably operates in the same manner as the actual writing sequence, and thus, is a ramp waveform in the present embodiment. The position control deflector amplifier 36 controls the operation of the deflector 15 based on the received scan position command value. The clock distributing unit 37 distributes a system clock for determining the operation timing of the entire lithography apparatus 1 into units provided within the controller 8. A stage control circuit 38 calculates a command target value to be input to the substrate stage 7 based on the stage position coordinates which are the command transmitted from the main control unit 30, and drives the substrate stage 7 such that the position of the substrate stage 7 after being driven reaches the target value. The stage control circuit 38 continuously scans the substrate 6 in the Y-axis direction by driving the substrate stage 7 during pattern writing. At this time, the deflector 15 deflects an image on the surface of the substrate 6 in the X-axis direction based on the length measurement result of the substrate stage 7 obtained by an interferometer. Then, the blanking deflector 13 controls the OFF operation of the irradiation of the electron beam 4 so as to obtain a target dose on the substrate 6. Furthermore, the main control unit 30 includes a data storage circuit 39 and a measurement sequence control unit 40. The data storage circuit 39 stores various data used when the main control unit 30 integrally performs a writing operation and data pertaining to various control circuits or the like. The measurement sequence control unit (hereinafter referred to as "measurement control unit") 40 is a processor that controls a measurement sequence to be described below, and transmits each drive command along the measurement sequence to the stage control circuit 38 or the deflection signal generating circuit 35. Note that the controller 8 further includes an exposure dose detector 41, a scanning speed calculating device 42, and a position calculating unit 43, and these units will be described in detail below.

Next, a description will be given of the acquisition of the relationship between a scan position command value obtained by the lithography apparatus 1 and a scan position of the electron beam 4. In general, since the lithography apparatus controls deflection scanning using a scanning deflector corresponding to the deflector 15 in the configuration described above, the relationship between the scan position command value for the deflector and the scan position of an electron beam needs to be accurately measured for improving writing accuracy. Furthermore, it is preferable that the relationship is linear. Accordingly, the lithography apparatus 1 of the present embodiment acquires the relationship in advance taking into account them by changing the incident position of the electron beam 4 relative to the detection surface of the detector 20 in the X-axis direction (scanning direction) and the Y-axis direction (orthogonal direction) upon performing writing on the substrate 6.

Figure 2:
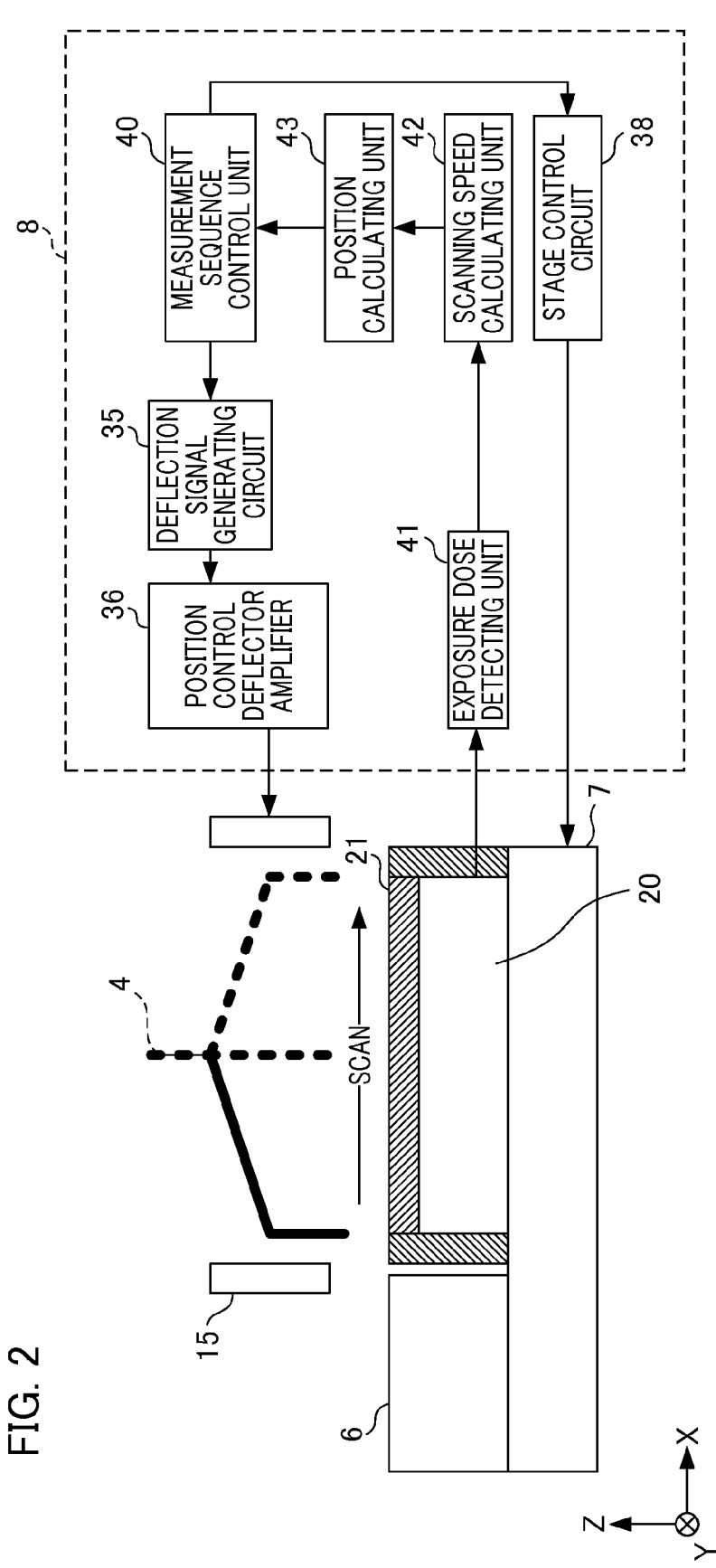
FIG. 2 is a diagram illustrating the configuration of essential parts of a charged particle beam lithography apparatus according to the first embodiment.
Figure 3:
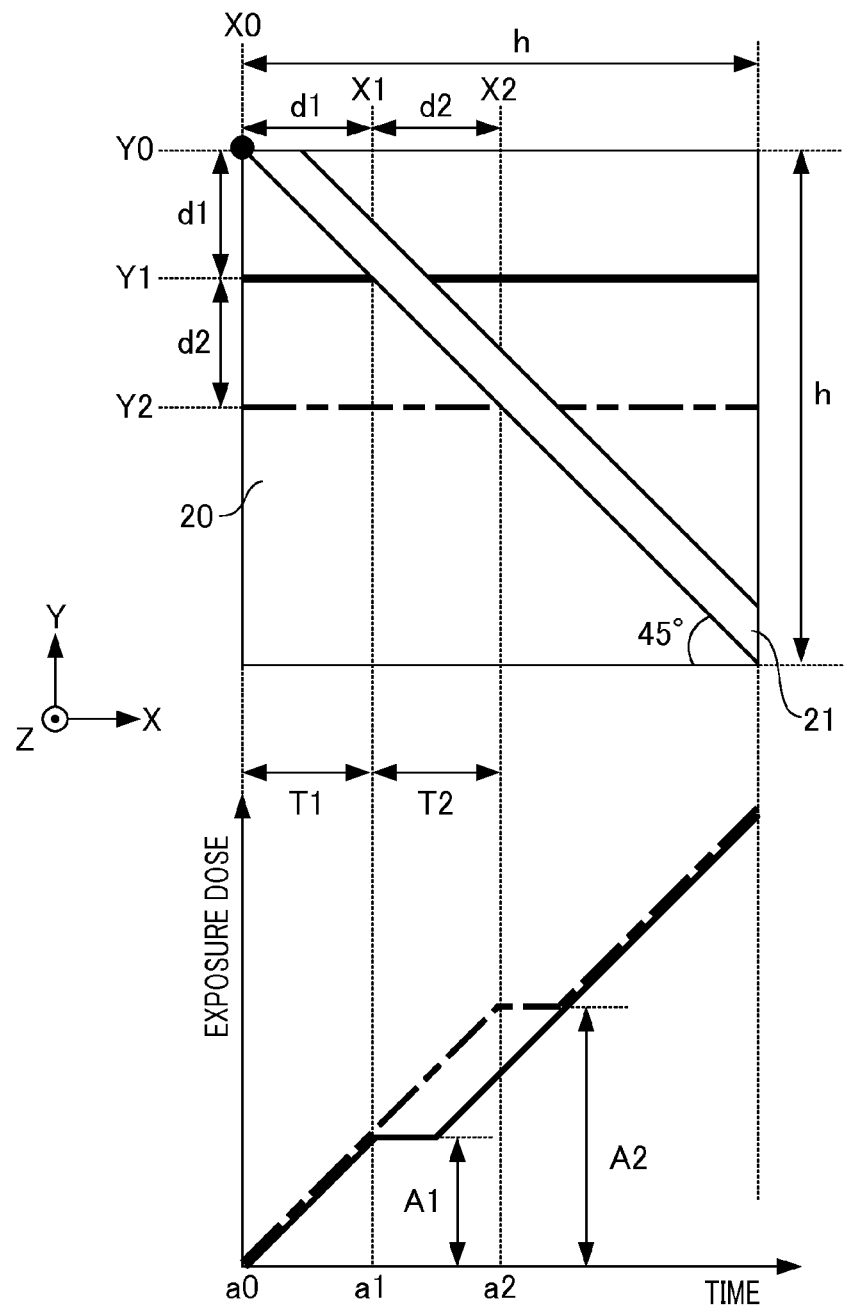
FIG. 3 is a diagram illustrating the configuration of a shield or the like and electron beam exposure dose according to the first embodiment.

FIG. 2 is a schematic diagram illustrating extracted essential parts according to acquisition of the relationship between a scan position command value and a scan position of the electron beam 4 among the components of the lithography apparatus 1. FIG. 3 is a plan view illustrating the configuration (shape) of the detection surface of the detector 20 and a shield 21 on the detection surface, and is a graph illustrating electron beam exposure dose with respect to a time corresponding to the plan view. Firstly, a description will be given of control circuits relating to the acquisition of the relationship in the controller 8 with reference to FIG. 2. The exposure dose detector 41 is configured by an integrator and an analog-digital converter. The exposure dose detector 41 integrates the output from the detector 20 and then converts the output into digital data to thereby transmit the output to the scanning speed calculating device 42. The scanning speed calculating device 42 calculates the scanning speed of the electron beam 4 in a specific continuous section from the integral value of the received exposure dose (i.e., exposure dose per unit time) and the position of the substrate stage 7. Furthermore, the position calculating unit 43 estimates the relationship between time and scan position from the scanning speed calculated by the scanning speed calculating device 42, and derives the relationship between a scan position command value output by the deflection signal generating circuit 35 and a scan position based on the relationship. Next, a description will be given of the configuration of the detector 20 and the shield 21 according to the present embodiment. Firstly, the detector 20 has a square detection surface having the length of a side equal to h, and it is preferable that the length h is equal to or greater than the size of the scan range of the electron beam 4 by the deflector 15. In particular, in the present embodiment, it is assumed that the length h is equal to the size of the scan range. The shield 21 is a board that is placed on top (at the electron beam incident side) of the detector 20 as shown in FIG. 2 and is arranged at a position at a different angle to the X axis as shown in the top of FIG. 3. The shield 21 has a function for changing the integration results of the exposure dose detector 41 by shielding only a specific region (effective region) against the electron beam 4 directed toward the detector 20 upon scanning the electron beam 4. The effective region of the shield 21 has a shape such that the position of the edge thereof in the scanning direction continuously changes in a direction perpendicular to the scanning direction. In the example shown in FIG. 3, the shield 21 is located on the diagonal of the detector 20, i.e., at a position tilted at an angle of 45 degrees such that the edge of one side is connected from the initial point having the X axis measurement start position of X0 and the Y axis measurement start position of Y0 to the final point of a distance (h, h). In conducting a measurement sequence to be described below, the controller 8 needs to acquire information about the position and the shape of the shield 21 in advance. As a method for determining the position and the shape of the shield 21, for example, the position and the shape of the shield 21 can be determined by detecting a specific reference mark (not shown) arranged on the substrate stage 7 and then driving the substrate stage 7 from the reference mark position until the shield 21 is irradiated with the electron beam 4.

Figure 4:
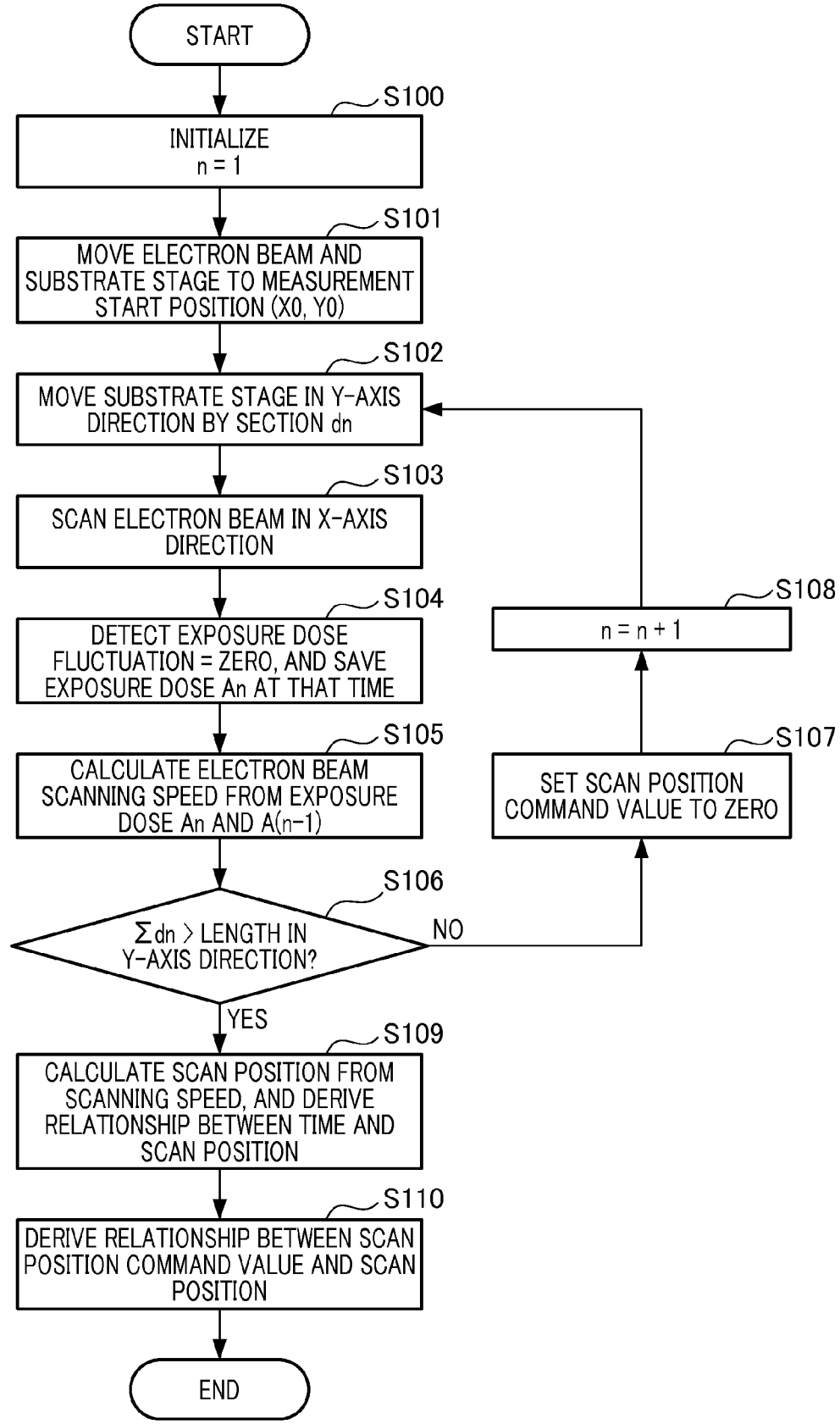
FIG. 4 is a flowchart illustrating a measurement sequence according to the first embodiment.

Next, a description will be given of a measurement sequence according to the present embodiment. FIG. 4 is a flowchart illustrating the measurement sequence. The integer n used in the following description denotes the number of repetitions. Firstly, as the initialization operation, a measurement control unit 40 determines a measurement start position and determines the exposure dose W of the electron beam 4 per unit time (step S100). Here, as a method for determining a measurement start position, the measurement control unit 40 firstly causes the detector 20 to detect a specific reference mark arranged on the substrate stage 7 in the state where the scan position command value is zero, and then qualifies the position measured by the interferometer at this time as the reference position. Next, the measurement control unit 40 drives the substrate stage 7 in the X-axis direction by means of the stage control circuit 38 until the detector 20 is irradiated with the electron beam 4 to thereby determine the stage position upon irradiation as the X axis measurement start position X0. Likewise, the measurement control unit 40 drives the substrate stage 7 in the Y-axis direction to thereby determine the stage position obtained when the detector 20 is not irradiated with the electron beam 4 as the Y axis measurement start position Y0. The exposure dose W can be determined by accumulated dose, which is obtained by integrating exposure dose when the measurement control unit 40 irradiates the detector 20 with the electron beam 4 for a predetermined time, and time.

Next, the measurement control unit 40 moves the substrate stage 7 to the measurement start position (X0, Y0) by means of the stage control circuit 38 in the state where the scan position command value is zero so as to align the incident position of the electron beam 4 with the measurement start position (step S101). Next, the measurement control unit 40 further moves the substrate stage 7 in the Y-axis direction by a section d1 by means of the stage control circuit 38 (step S102). Next, the measurement control unit 40 causes the deflection signal generating circuit 35 to transmit the scan position command value to the position control deflector amplifier 36 at the timing of the rising edge of a system clock and to start scanning of the electron beam 4 in the X-axis direction (step S103). Here, when the electron beam 4 passes through on the detector 20, the accumulated dose monotonously increases. In particular, when the electron beam 4 is passing through on the shield 21, the fluctuation amount is zero as shown in the bottom of FIG. 3. Accordingly, the measurement control unit 40 saves an accumulated dose A1 obtained when the fluctuation amount is zero in the data storage circuit 39 (step S104).

Next, the measurement control unit 40 causes the scanning speed calculating device 42 to calculate the scanning speed V_AVE1 of the electron beam 4 in the specific section (step S105). Here, the scanning speed V_AVEn is obtained by the following Formulae (1) and (2):

$$(An-A(n-1))/W=Tn \quad (1)$$

$$V\_AVEn=dn/Tn \quad (2)$$

Assuming that the accumulated dose at the measurement start position is A0, when the fluctuation amount is zero, the accumulated dose A0 is also zero because the fluctuation amount immediately after the start of the operation is zero. From Formulae (1) and (2), the scanning speed V_AVE1 in the section between X0 and X1 is obtained by the following Formulae (3) and (4):

$$(A1-A0)/W=T1 \quad (3)$$

$$V\_AVE1=d1/T1 \quad (4)$$

Next, the measurement control unit 40 compares the integrated value (Σdn) in the sections dn with the length h of the detector 20 in the Y-axis direction (step S106). Here, when the measurement control unit 40 determines that the integrated value in the sections dn is less than the length h in the Y-axis direction (NO in step S106), the measurement control unit 40 returns the scan position command value to zero (step S107), and then increments the value of n (step S108). Then, the process returns to step S102 again, and the measurement control unit 40 executes the processing from steps S102 to S105. When the accumulated dose obtained in a second step S104 is assumed to be A2, the scanning speed V_AVE2 in the section between X1 and X2 is obtained by the following Formulae (5) and (6):

$$(A2-A1)/W=T2 \quad (5)$$

$$V\_AVE2=d2/T2 \quad (6)$$

As described above, the measurement control unit 40 acquires an accumulated dose An by repeatedly executing the processes from steps S102 to S108 until the integrated value in the sections dn is greater than the length h in the Y-axis direction to thereby calculate the scanning speed V_AVEn of the electron beam 4 in the sections dn. When the measurement control unit 40 determines in step S106 that the integrated value in the sections dn is greater than the length h in the Y-axis direction (YES in step S106), the process shifts to step S109.

Figure 5:
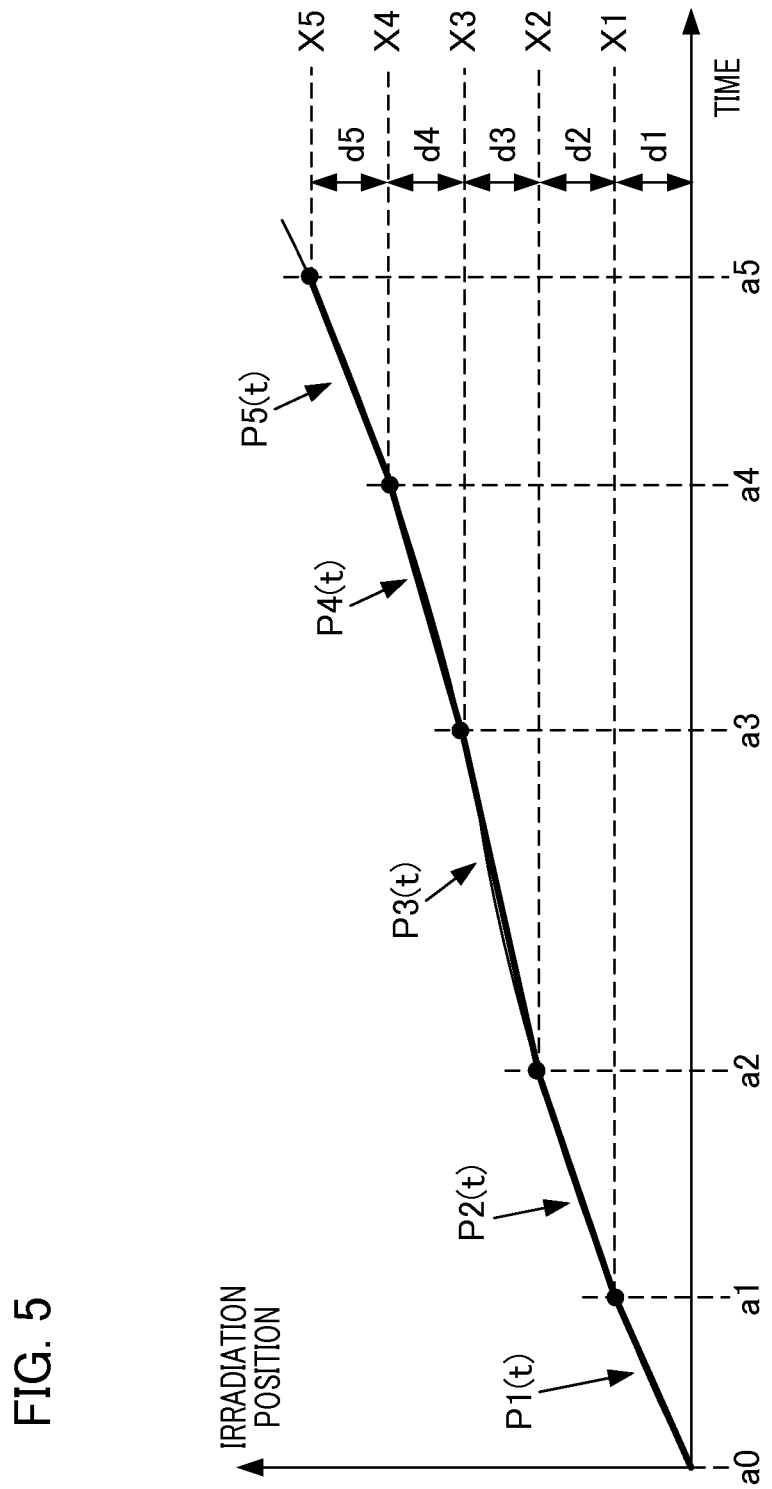
FIG. 5 is a graph illustrating a scan position with respect to a time according to the first embodiment.

Next, the measurement control unit 40 derives the relationship between the time and the scan position in the sections dn from the scanning speed V_AVEn of the electron beam 4 calculated in step S105 (step S109). FIG. 5 is a graph illustrating a scan position with respect to a time obtained by the relationship derived in step S109. Here, the time "an" elapsed from the scanning start to the scanning edge of the electron beam 4 is obtained by the following Formula (7). For example, when the measurement control unit 40 executes the repetition processing until n is equal to five, the relationship Pn(t) between the time and the scan position in each section from d1 to d5 is represented by the following Formulae (8) to (12):

$$an = a(n-1) + Tn \quad (7)$$

$$P1(t) = V\_AVE1 \times t \quad (a0 \le t < a1) \quad (8)$$

$$P2(t) = V\_AVE2 \times (t-a1) + X1 \quad (a0 \le t < a1) \quad (9)$$

$$P3(t) = V\_AVE3 \times (t-a2) + X2 \quad (a1 \le t < a2) \quad (10)$$

$$P4(t) = V\_AVE4 \times (t-a3) + X3 \quad (a2 \le t < a3) \quad (11)$$

$$P5(t) = V\_AVE5 \times (t-a4) + X4 \quad (a3 \le t < a4) \quad (12)$$

Next, the measurement control unit 40 determines the relationship between scan position command value and scan position from the relationship between time and scan position obtained in step S109 (step S110). FIGS. 6A and 6B are graphs relating to scan position command values. In particular, FIG. 6A shows a scan position command value with respect to a time, and FIG. 6B shows a scan position with respect to a scan position command value. FIGS. 6A and 6B show an example with reference to eleven data from data 1 to data 11. Here, the scan position command value is updated at the timing of the rising edge of the system clock of the lithography apparatus 1 as described above. Thus, the relationship shown in FIG. 6A can be determined from the cycle of the system clock and the number of clocks. Furthermore, the relationship shown in FIG. 6B can be determined from the relationship between the time and the scan position and the relationship between the time and the scan position command value obtained in advance. In other words, in the present embodiment, the accuracy of the estimation of the scan position with respect to the scan position command value is determined by the drive distance (the section dn) of the substrate stage 7 defined in step S102, and thus, the relationship between the scan position command value and the scan position can be determined with high accuracy with decrease in the section dn. The measurement control unit 40 determines the relationship between the scan position command value and the scan position in step S110, and then ends the measurement sequence.

Upon performing pattern writing, the measurement control unit 40 functions as a correcting unit that directly corrects a scan position command value to be actually transmitted in advance by adjusting conditions such that the relationship between the scan position command value and the scan position obtained by the measurement sequence changes linearly. The main control unit 30 may also function as a correcting unit that corrects a scan position command value to be actually transmitted in advance by correcting writing data or the position of the substrate stage 7 from the obtained relationship between the scan position command value and the scan position. As described above, the lithography apparatus 1 can derive the relationship between the scan position command value and the scan position with high accuracy to thereby execute control of scan position with high accuracy with reference to the derived relationship, resulting in improvement in writing accuracy.

As described above, according to the present embodiment, a lithography apparatus that is advantageous for improving writing accuracy may be provided.

(Second Embodiment)

Figure 7:
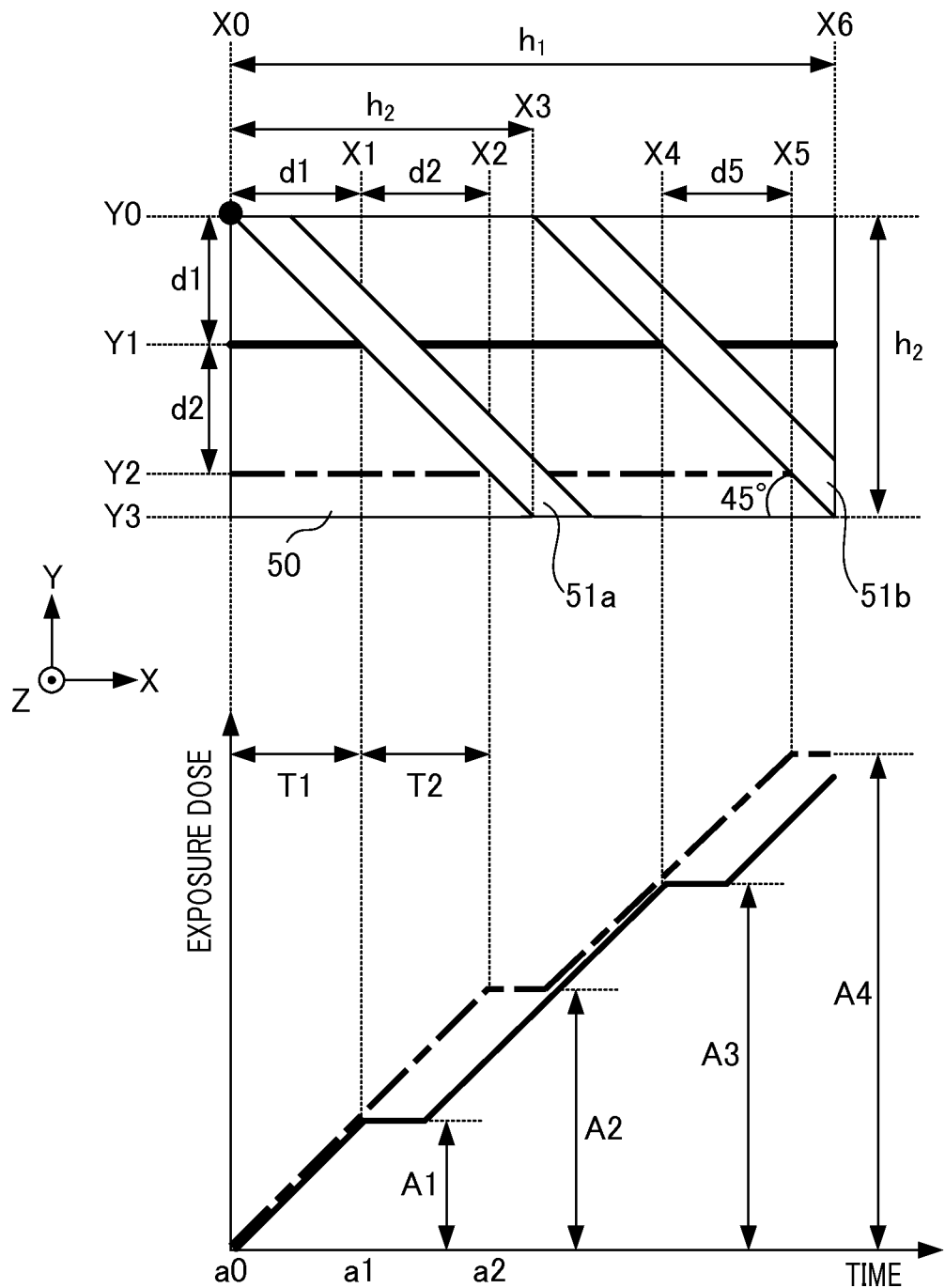
FIG. 7 is a diagram illustrating the configuration of a shield or the like and electron beam exposure dose according to a second embodiment

Next, a description will be given of a lithography apparatus according to a second embodiment of the present invention. A feature of the lithography apparatus of the present embodiment lies in the fact that the configuration (shape) of the detection surface of a detector and a shield placed on the detection surface is different from that in the first embodiment. FIG. 7 is a plan view illustrating the configuration of the detection surface of a detector 50 and a shield 51 on the detection surface according to the present embodiment, and is a graph illustrating exposure dose of the electron beam 4 with respect to a time corresponding to the plan view. In the present embodiment, the detector 50 has a rectangular detection surface in which the length $h_2$ in the Y-axis direction is half ($h_1/2$) of the length $h_1$ in the X-axis direction. In particular, the length $h_1$ is equal to the size of the scan range of the electron beam 4 by the deflector 15. Furthermore, the shield 51 consists of a first shield 51a and a second shield 51b that are placed on top of the detector 50 and are located at a position at an angle of 45 degrees to the X axis as shown in the top of FIG. 7. In particular, the first shield 51a is located such that the edge of one side is connected from the initial point having the X axis measurement start position of X0 and the Y axis measurement start position of Y0 to the position (X3, Y3) (both have the length of $h_2$). On the other hand, the second shield 51b is located such that the edge of one side is connected from the initial point having the position of (X3, Y0) to the position of (X6, Y3) (the length $h_1$, $h_2$).

Taking into account such configuration, the measurement sequence of the first embodiment shown in FIG. 4 is changed in the present embodiment as follows. Firstly, in the measurement sequence of the present embodiment, the processes from steps S100 to S103 are the same as those in the first embodiment. Next, in step S104 of the present embodiment, when the electron beam 4 passes through on the detector 50, the accumulated dose monotonously increases. In particular, when the electron beam 4 is passing through on the first shield 51a and the second shield 51b as shown in the bottom of FIG. 7, the fluctuation amount is zero. In other words, in the present embodiment, two accumulated doses, i.e., the accumulated dose A1 between X0 and X1 and the accumulated dose A3 between X0 and X4 can be obtained by one time scanning in the X-axis direction in step S103. At this time, the measurement control unit 40 stores the accumulated dose A1 and A3 obtained when the fluctuation amount is zero in the data storage circuit 39. Next, as in step S105 of the first embodiment, the measurement control unit 40 causes the scanning speed calculating device 42 to calculate the scanning speed V_AVE1 of the electron beam 4 in the specific section. Next, in step S106 of the present embodiment, the measurement control unit 40 compares the integrated value ($\Sigma$dn) in the sections dn with the length $h_2$ of the detector 50 in the Y-axis direction. Here, as in the first embodiment, when the measurement control unit 40 determines that the integrated value in the sections dn is less than the length $h_2$ in the Y-axis direction (NO in step S106), the measurement control unit 40 returns the scan position command value to zero (step S107), and then increments the value of n (step S108). Then, the process returns to step S102 again, and the measurement control unit 40 executes the processing from steps S102 to S105. In particular, in the present embodiment, two accumulated doses A2 and A4 are obtained in a second step S104. At this time, the scanning speed V_AVE2 in the section between X1 and X2 is obtained by the above Formulae (5) and (6), whereas the scanning speed V_AVE5 in the section between X4 and X5 is obtained by the following Formulae (13) and (14):

$$(A4-A3)/W=T5 \quad (13)$$

$$V\_AVE5=d5/T5 \quad (14)$$

The following steps are the same as those in the measurement sequence of the first embodiment.

As described above, in the present embodiment, two accumulated doses A1 and A3 are obtained by one time scanning in the X-axis direction in step S104. Thus, when taking into account the same accuracy as that of the first embodiment, the lithography apparatus of the present embodiment can derive the relationship between the scan position command value and the scan position within half of the time in the first embodiment. While, in the present embodiment, the number of installation of the shields 51 is two, the number of installation of the shields 51 may be three or more so as to shorten time.

(Third Embodiment)

Figure 8:
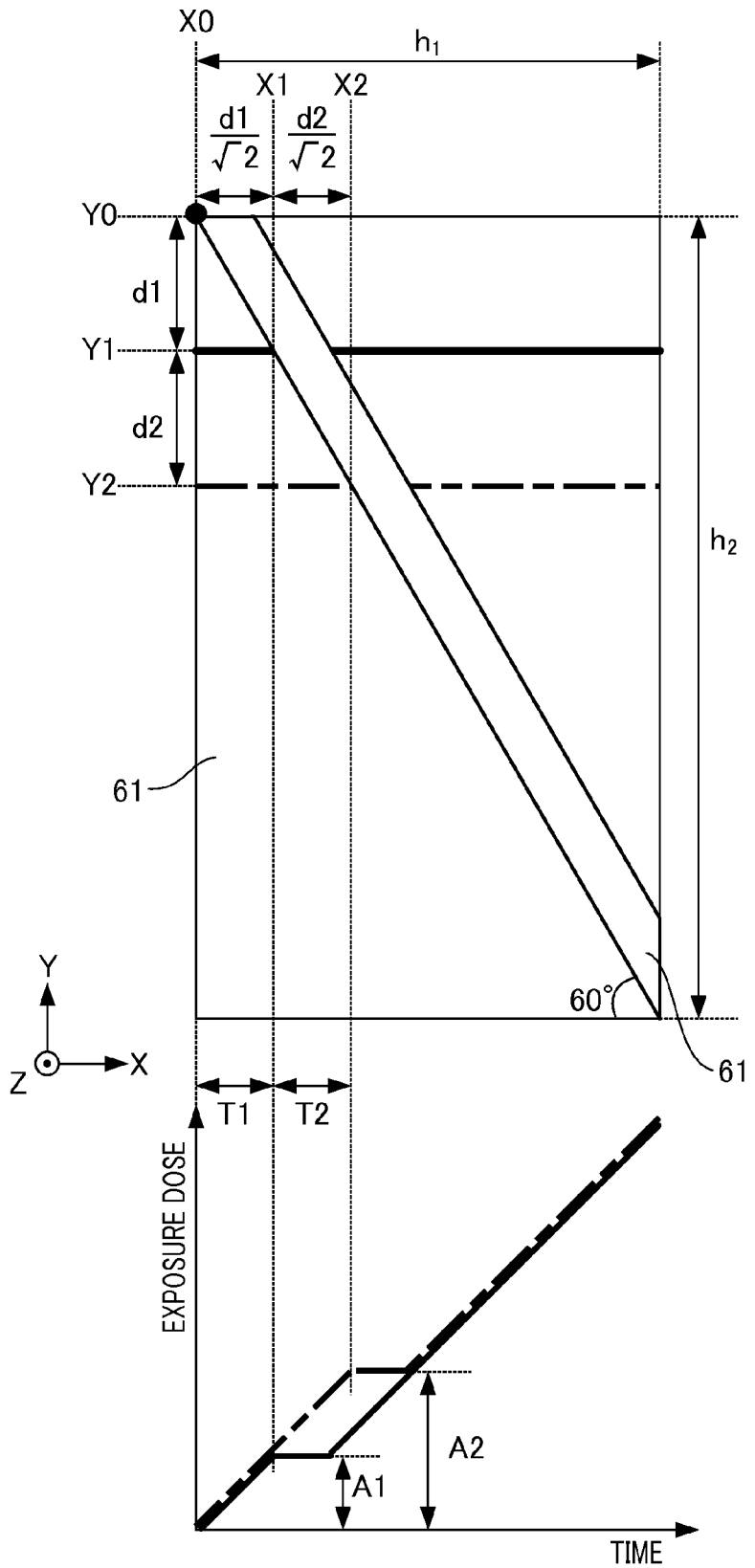
FIG. 8 is a diagram illustrating the configuration of a shield or the like and electron beam exposure dose according to a third embodiment

Next, a description will be given of a lithography apparatus according to a third embodiment of the present invention. A feature of the lithography apparatus of the present embodiment lies in the fact that the configuration (shape) of the detection surface of a detector and a shield placed on the detection surface is further different from that in the first embodiment. FIG. 8 is a plan view illustrating the configuration of the detection surface of a detector 60 and a shield 61 on the detection surface according to the present embodiment, and is a graph illustrating exposure dose of the electron beam 4 with respect to a time corresponding to the plan view. In the present embodiment, the detector 60 has a rectangular detection surface in which the length $h_2$ in the Y-axis direction is the product of $\sqrt{2}$ and the length $h_1$ in the X-axis direction. In particular, the length $h_1$ is equal to the size of the scan range of the electron beam 4 by the deflector 15. Furthermore, the shield 61 is placed on top of the detector 50 and is located on the diagonal of the detector 50, i.e., at a position tilted at an angle of 60 degrees as shown in the top of FIG. 8.

Taking into account such configuration, the measurement sequence of the first embodiment shown in FIG. 4 is changed in the present embodiment as follows. Firstly, in the measurement sequence of the present embodiment, the processes from steps S100 to S104 are the same as those in the first embodiment. Next, in step S105, the measurement control unit 40 causes the scanning speed calculating device 42 to calculate the scanning speed V_AVE1 of the electron beam 4 in the specific section. However, in the present embodiment, the scanning speed V_AVEn is obtained by the above Formula (1) and the following Formula (15):

$$V\_AVEn=(dn\sqrt{2})/Tn \quad (15)$$

Next, in step S106 of the present embodiment, the measurement control unit 40 compares the integrated value (Σdn) in the sections dn with the length $h_2$ of the detector 60 in the Y-axis direction. Here, in the first embodiment, since the installation angle of the shield 21 is 45 degrees, the step drive distance (the section dn) of the substrate stage 7 is the same as the section of the scanning speed of the electron beam 4 to be calculated. In contrast, in the present embodiment, since the installation angle of the shield 61 is 60 degrees, the section of the scanning speed of the electron beam 4 to be calculated relative to the step drive section dn of the substrate stage 7 is $dn/\sqrt{2}$. In other words, when the step drive distance of the substrate stage 7 is dn as in the first embodiment, the measurement control unit 40 calculates the scanning speed of the electron beam 4 in a narrower section than that in the first embodiment. Thus, the lithography apparatus of the present embodiment can derive the relationship between the scan position command value and the scan position with high accuracy. Considering the opposite case where the installation angle of a shield is set to less than 45 degrees, the relationship between the scan position command value and the scan position can also be coarsely derived. In other words, in the present invention, the installation angle of a shield is variable and can be set to any value depending on the required accuracy, measurement time, or the like. Furthermore, the effects of the lithography apparatus of the present embodiment may also be provided by decreasing or increasing the step drive distance (the width of each section dn) of the substrate stage 7 in the first embodiment.

In the measurement sequence of the embodiments described above, the measurement control unit 40 moves the substrate stage 7 in the Y-axis direction by the section d1 in step S102. In contrast, when the lithography apparatus 1 includes not only the deflector 15 but also a second deflector for scanning the Y axis that can emit the electron beam 4 at a desired position in the Y-axis direction, the movement of the substrate stage 7 in step S102 may also be replaced with the movement of the second deflector. More specifically, the measurement control unit 40 causes the second deflector to move the scan position of the electron beam 4 in the Y-axis direction by the section dn, so that the same effects obtained when the substrate stage 7 is moved in the Y-axis direction by the section dn may be provided. It should be noted that, as the precondition in this case, the relationship between the scan position command value for the second deflector and the scan position needs to be acquired in advance.

(Article Manufacturing Method)

An article manufacturing method according to an embodiment of the present invention is preferred in manufacturing an article, for example, a micro device such as a semiconductor device or the like or an article such as an (optical) element or the like having a microstructure. The article manufacturing method may include a step of forming a latent image pattern on a substrate, on which a photosensitive material is coated, using the aforementioned lithography apparatus (a step of writing a pattern on a substrate); and a step of developing the substrate on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-034658 filed on Feb. 21, 2012 which is hereby incorporated by reference herein in its entirety.

What is claimed is:

1. A lithography apparatus that scans a charged particle beam on a substrate and performs writing on the substrate, the apparatus comprising:
a stage configured to hold the substrate and to be movable;
a deflector configured to deflect the charged particle beam to scan the charged particle beam;
a detector including a shield for shielding the charged particle beam, configured to be provided on the stage, and to detect an intensity of the charged particle beam not shielded by the shield; and
a controller configured to control a deflecting operation of the deflector depending on a deflection signal;
wherein the detector has a first detecting-start position and a second detecting-start position, the second detecting-start position being different from the first detecting-start position in a second direction orthogonal to a first direction that is parallel to a scan direction of the charged particle beam, for starting to detect the intensity of the charged particle beam,
wherein the edge of the shield has a first shielding position, the first shielding position being different from the first detecting-start position in the first direction and being equal to the first detecting-start position in the second direction, and a second shielding position, the second shielding position being different from the second detecting-start position in the first direction, being equal to the second detecting-start position in the second direction and being different from the first shielding position in the first and second direction,
wherein the controller controls the deflecting operation depending on a deflection signal so that the detector detects an intensity of the charged particle beam in a first detecting period in which the deflector scans the charged particle beam from the first detecting-start position to the first shielding position on the detector,
wherein the controller controls the deflecting operation depending on a deflection signal so that the detector detects an intensity of the charged particle beam in a second detecting period in which the deflector scans the charged particle beam from the second detecting-start position to the second shielding position on the detector, and
wherein the controller includes a processor configured to determine a relationship between the deflection signal and a scan position of the charged particle beam scanned depending on the deflection signal, based on the intensity of the charged particle beam detected in the first detecting period and the intensity of the charged particle beam detected in the second detecting period.

2. The apparatus according to claim 1,
wherein the controller is configured to correct at least one of the deflection signal and writing data based on the relationship determined by the processer.

3. The apparatus according to claim 1, wherein the first shielding position and the second shielding position are variable.

4. The apparatus according to claim 1, wherein the controller is configured to change a detecting period from the first detecting period to the second detecting period by moving the detector.

5. The apparatus according to claim 1, wherein the controller is configured to change a detecting period from the first detecting period to the second detecting period by scanning the charged particle beam.

6. The apparatus according to claim 1, wherein a size of a detection surface of the detector is not smaller than that of a scan range of the charged particle beam in the first direction.

7. A method for manufacturing an article, the method comprising:
writing on a substrate using a lithography apparatus;
developing the substrate having undergone the writing; and
processing the developed substrate to manufacture the article,
wherein the lithography apparatus scans a charged particle beam on the substrate and performs the writing on the substrate, the apparatus including:
a stage configured to hold the substrate and to be movable;
a deflector configured to deflect the charged particle beam and to scan the charged particle beam;
a detector, including a shield that shields the charged particle beam, configured to be provided on the stage, and to detect an intensity of the charged particle beam not shielded by an edge of the shield; and
a controller configured to control a deflecting operation of the deflector depending on a deflection signal,
wherein the detector has a first detecting-start position and a second detecting-start position, the second detecting-start position being different from the first detecting-start position in a second direction orthogonal to a first direction that is parallel to a scan direction of the charged particle beam, for starting to detect the intensity of the charged particle beam,
wherein the edge of the shield has a first shielding position, the first shielding position being different from the first detecting-start position in the first direction and being equal to the first detecting-start position in the second direction, and a second shielding position, the second shielding position being different from the second detecting-start position in the first direction, being equal to the second detecting-start position in the second direction and being different from the first shielding position in the first and second direction,
wherein the controller controls the deflecting operation depending on a deflection signal so that the detector detects an intensity of the charged particle beam in a first detecting period in which the deflector scans the charged particle beam from the first detecting-start position to the first shielding position on the detector,
wherein the controller controls the deflecting operation depending on a deflection signal so that the detector detects an intensity of the charged particle beam in a second detecting period in which the deflector scans the charged particle beam from the second detecting-start position to the second shielding position on the detector, and
wherein the controller includes a processor configured to determine a relationship between the deflection signal and a scan position of the charged particle beam scanned depending on the deflection signal, based on the intensity of the charged particle beam detected in the first detecting period and the intensity of the charged particle beam detected in the second detecting period.

8. A lithography apparatus that scans a charged particle beam on a substrate and performs writing on the substrate based on a writing data, the apparatus comprising:
a stage configured to hold the substrate and to be movable;
a deflector configured to deflect the charged particle beam and to scan the charged particle beam;
a detector, including a shield that shields the charged particle beam, configured to be provided on the stage, and to detect an intensity of the charged particle beam not shielded by an edge of the shield; and a controller configured to control a deflecting operation of the deflector depending on a deflection signal, and to control a moving operation of the stage depending on a movement signal, at a predetermined timing, wherein the detector has a first detecting-start position and a second detecting-start position, the second detecting-start position being equal to the first detecting-start position in a first direction parallel to a scan direction of the charged particle beam and being different from the first detecting-start position in a second direction orthogonal to the scan direction, for starting to detect the intensity of the charged particle beam by the detector, wherein the edge of the shield has a first shielding position, the first shielding position being different from the first detecting-start position in the first direction and being equal to the first detecting-start position in the second direction, and a second shielding position, the second shielding position being different from the second detecting-start position in the first direction, being equal to the second detecting-start position in the second direction and being different from the first shielding position in the first and second direction, wherein the controller controls the deflecting operation depending on a deflection signal so that the detector detects an intensity of the charged particle beam in a first detecting period in which the deflector scans the charged particle beam from the first detecting-start position to the first shielding position on the detector, wherein, thereafter, the controller controls the moving operation of the stage depending on a movement signal for moving the charged particle beam from the first shielding position to the second detecting-start position, wherein, further thereafter, the controller controls the deflecting operation depending on a deflection signal so that the detector detects an intensity of the charged particle beam in a second detecting period in which the deflector scans the charged particle beam from the second detecting-start position to the second shielding position on the detector, and wherein the controller includes:

a processor configured to determine a scan speed of the charged particle beam scanned depending on the deflection signal based on the intensity of the charged particle beam detected in the first detecting period, and to determine a relationship between the deflection signal and a scan position of the charged particle beam scanned depending on the deflection signal based on the determined scan speed of the charged particle beam, within a section from a position equal to the first detecting-start position in the scan direction to a position equal to the first shielding position in the scan direction, and configured to determine a scan speed of the charged particle beam scanned depending on the deflection signal based on the intensity of the charged particle beam detected in the first detecting period and the intensity of the charged particle beam detected in the second detecting period, and to determine a relationship between the deflection signal and the scan position of the charged particle beam scanned depending on the deflection signal based on the determined scan speed of the charged particle beam, within a section from the position equal to the first shielding position in the scan direction to a position equal to the second shielding position in the scan direction; and a correcting unit configured to correct a least one of the writing data, the deflection signal and the movement signal based on a result determined by the processer.

* * * * *